United States Patent [19]

Piaget

[11] Patent Number: 4,947,084
[45] Date of Patent: Aug. 7, 1990

[54] CATHODE RAY TUBE FOR STORING AND REPRODUCING ELECTRICAL SIGNALS

[75] Inventor: Claude Piaget, Montgeron, France

[73] Assignee: U.S. Philips Corporation, New York, N.Y.

[21] Appl. No.: 368,961

[22] Filed: Jun. 19, 1989

Related U.S. Application Data

[63] Continuation of Ser. No. 185,287, Apr. 11, 1988, abandoned, which is a continuation of Ser. No. 925,582, Oct. 31, 1986, abandoned.

[30] Foreign Application Priority Data

Feb. 28, 1986 [FR] France ................... 8602822

[51] Int. Cl.$^5$ ................... H01J 31/06; H01J 31/58
[52] U.S. Cl. ................... 315/8.51; 313/398; 313/392
[58] Field of Search ............... 315/8.51, 8.61; 324/121 R; 313/391, 392, 397, 398; 358/241

[56] References Cited

U.S. PATENT DOCUMENTS

| | | | |
|---|---|---|---|
| 3,798,633 | 3/1974 | Hofstein | 315/8.51 X |
| 4,079,289 | 3/1978 | Courtan | 313/391 X |
| 4,104,568 | 8/1978 | Johnson | 315/8.51 X |
| 4,301,520 | 11/1981 | Green | 358/213.26 X |
| 4,325,023 | 4/1982 | Zirwick | 324/77 C |
| 4,325,084 | 4/1982 | van Gorkom et al. | 358/241 |
| 4,490,643 | 12/1984 | Silver | 313/391 |
| 4,532,453 | 7/1985 | Kato | 313/392 X |
| 4,599,541 | 7/1986 | Kato | 315/8.51 |
| 4,642,519 | 2/1987 | Nakatsugawa et al. | 315/1 |

FOREIGN PATENT DOCUMENTS

| | | | |
|---|---|---|---|
| 58-88669 | 5/1983 | Japan | 315/1 |
| 59-97661 | 6/1983 | Japan | 315/1 |
| 1150677 | of 0000 | U.S.S.R. | |
| 1087900 | 4/1984 | U.S.S.R. | 315/1 |

OTHER PUBLICATIONS

*Charge Transfer Devices*, Séquin et al., Academic Press, 1975, pp. 53–59, 153–157.
*Charge–Coupled Devices & Systems*, Howes et al., John Wiley & Sons, 1981, pp. 73–79.
Metzger et al, "Triggered Oscilliscope", *Radio Electronic*, vol. 51, No. 4, pp. 39–43, 80, Apr. 1980.

Primary Examiner—James J. Groody
Assistant Examiner—Mark R. Powell
Attorney, Agent, or Firm—Robert J. Kraus

[57] ABSTRACT

In a vacuum tube oscillscope for storing and reproducing electric signals, two matrices of charge transfer devices (CTDs) register and then reproduce the electric signals on a display screen. The two CTDs (21, 22) are juxtaposed at their sensitive areas (23, 24) without any interruption in accordance with a boundary which is substantially perpendicular to the time base deflection. The CTDs are scanned in accordance with trace and retrace write scan sequences. This facilitates reproducing the electric signals with pre-triggering.

8 Claims, 3 Drawing Sheets

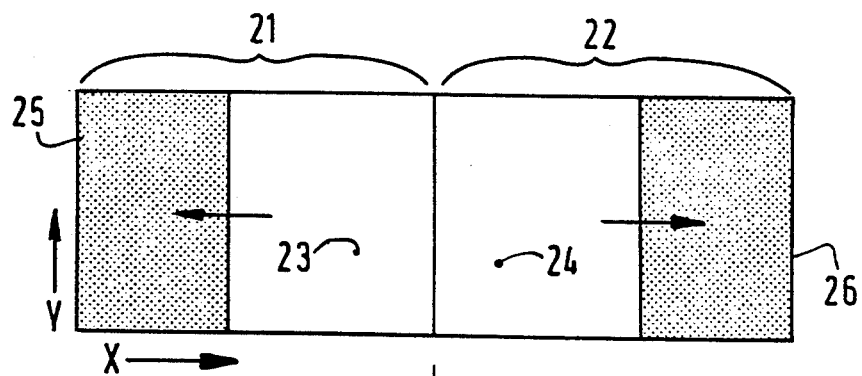
FIG.2
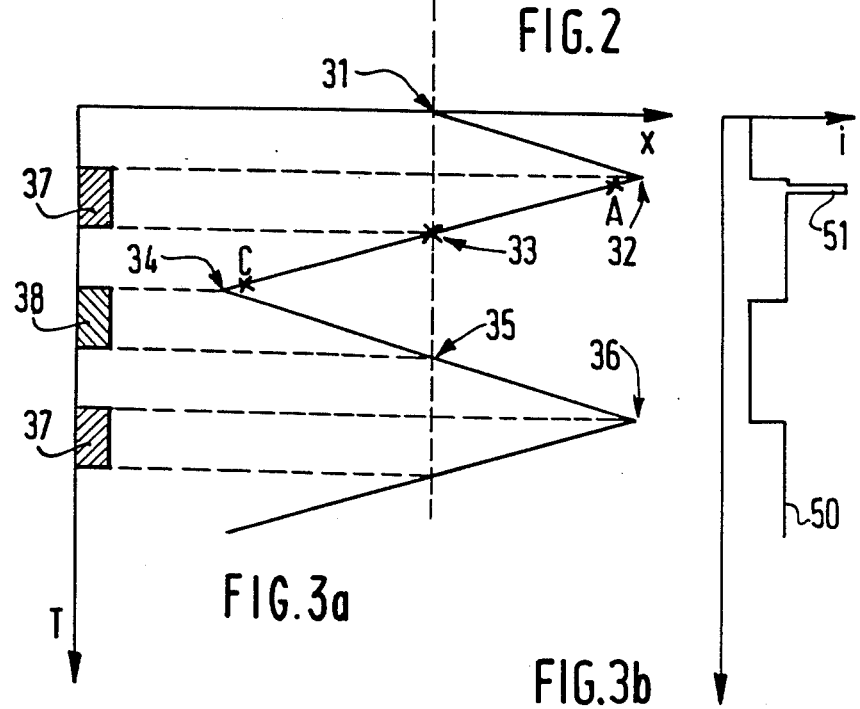
FIG.3a
FIG.3b

CATHODE RAY TUBE FOR STORING AND REPRODUCING ELECTRICAL SIGNALS

This is a continuation of application Ser No. 07/185,287 filed Apr. 11, 1988, which is a continuation of abandoned application Ser. No. 925,582 filed on Oct. 31, 1986 now abandoned.

BACKGROUND OF THE INVENTION

The invention relates to an apparatus for storing and reproducing electric signals to be analysed. The apparatus comprises a vacuum tube provided with an electron gun for emitting an electron beam which is subjected to the influence of the electric signals to an analysed and which is controlled by a beam focusing and deflection system for writing the trace of the electric signals to be analysed on the sensitive areas of two matrices of charge transfer devices in the form of stored charges. Electric signals corresponding to the stored charges are derived from the tube by means of read registers; these signals are processed in processing circuits and then displayed in the form of electric signals reproduced on a display screen.

An apparatus of this type is known from the Soviet document SU No. 1150677. This known apparatus comprises an electron source, an electron beam focussing and deflection system and a target formed by two matrices of charge transfer devices (CTDs). The electron beam whose current is modulated in accordance with an input signal to be analysed is directed towards one or other of the CTDs by a selection device. The two CTDs are superposed so that the boundary which separates them is parallel to the horizontal direction of scanning effected by a time base. The electron beam which is modulated in intensity by the signal can thus write its information in each CTD on the sensitive regions constituted by two or three rows of CTDs located on either side of this boundary. The charge quantity at each point in this region of 2 or 3 rows is thus representative of the signal to be analysed. Although the electron beam is focussed, the beam spot is sufficiently large to write on 2 or 3 rows at a time, on one of the CTDs when scanning in one direction, termed tracing, and on the other of the CTDs when scanning in the opposite direction, termed retracing; the tracing and retracing being continuous. When the charges are stored in the 2 or 3 rows, they are transferred and added in accordance with the columns of the CTD to an output register with the aid of different clock pulses. The registers of each CTD operate alternately in opposite senses corresponding to their inscription for depleting their charges to an output amplifier which is connected to a processing and display circuit.

This prior art apparatus has for its object to enhance the conversion precision of the signal to be analysed, to increase the volume of the registered signals and to realise an uninterrupted conversion at a writing speed which is slower than the transfer speed of the charges by the output registers.

This device can be used in automatic control and data display systems or in oscillograph systems, but it does not have an operating speed which is fast enough for modern oscilloscopes.

Furthermore it does not provide the possibility of effecting pre-triggering, which is very useful and appreciated by users of oscilloscopes. Pre-triggering consists of the following. For obtaining a stable image on the screen, the time base in an oscilloscope is triggered by the signal to be observed in accordance with thresholds which can be modified. This signal must thus have a sufficient level for effecting this triggering. The events in the signals which are produced just before the triggering instant are thus lost. Particularly when the signal is a non-recurrent signal, one part of the information contained in the signal cannot be observed. Pre-triggering thus consists of preserving in the memory samples which precede and succeed, in time, the triggering instant. Thus, ultimately it is only possible to reproduce the form of the signal thus memorised on a display screen.

This prior art device does not provide a solution for storing in accordance with pre-triggering.

SUMMARY OF THE INVENTION

It is an object of the invention to enable of pre-triggering the signal in a large range of high frequencies for an oscilloscope for digitally treating the signal.

According to the one aspect of the present invention an apparatus for storing and reproducing electric signals to be analysed, comprises a vacuum tube provided with an electron gun for emitting an electron beam which is subjected to the influence of the electric signals to be analysed. The electron gun is controlled by a beam focusing and deflection system for writing the trace of the electric signals to be analysed on the sensitive areas of two matrices of charge transfer devices in the form of stored charges which are derived from the tube by means of read registers for subsequent processing in processing circuits. The signals are then reproduced on a display screen. The two matrices of the charge transfer device are juxtaposed at their sensitive areas without any interruption along a boundary which is substantially perpendicular to the scanning direction X corresponding to the time base deflection. The electron beam is deflected in a direction Y which is substantially perpendicular to the direction X by the electric signals to be analysed so that the trace originating from the beam acts alternately on the surfaces of the sensitive areas of the two matrices of the charge transfer device in accordance with trace and retrace write scan sequences. These sequences are stopped by the appearance of a triggering signal upon termination of the writing cycle of the matrix on which writing is effected. The enables a pre-triggering registering and reproducing operation for storing and subsequently displaying on a display screen which signal corresponds to the parts of the signal preceding and succeeding the occurrence of the triggering signal.

According to another aspect of the present invention there is provided an oscilloscope including storing and reproducing means made in accordance with the first mentioned aspect of the present invention.

In the apparatus in accordance with the present invention the beam current of the tube can be modulated by locally loading the CTDs with a quantity of charges in order to create a bright dot on the display screen defining the state of a flag marker corresponding to the scanning direction of the CTDs by the beam. The beam current of the tube can also be modulated by locally loading the CTDs with a further quantity of charges in order to create a further bright spot on the display screen defining the triggering instant.

The invention utilizes the fact that CTDs can generally be erased much faster than is possible during normal reading of the image.

An embodiment of a device made in accordance with the invention is constituted by a vacuum envelope comprising an electron gun emitting a writing electron beam which can be deflected in one direction by the signal to be analysed and in an orthogonal direction by a time base.

According to a first embodiment of the present invention the electron beam excites the phosphor of a tube screen, the image on which screen is optically coupled by fibre optical plate to the CTDs which are on the output side of the plate and which are excited in a photosensitive mode. This fibre optical plate may be formed as an optical reducing plate for adapting the large field of the screen to the useful smaller field of the CTD.

According to a second embodiment of the present invention the electron beam directly excites the CTDs in accordance with an electron-sensitive mode.

According to these two sensitivity modes of the CTDs, the two matrices of the CTDs are juxtaposed so that the space which separates them is as small as possible. The CTDs are usually arranged so that they have a sensitive area on the illuminated area or in the electron beam scanned area and a masked area used for reading the sensitive area. The two CTDs are thus juxtaposed by their sensitive areas.

The invention also utilizes the fact that the field memory of a CTD is used for transferring the field so as to increase the pre-triggering ratio.

The two matrices of the CTD can be formed by a double CTD provided in the same substrate. In the case of the first embodiment the optical field of the tube screen can be adapted to the optical field of the sensitive areas of the two CTD matrices or of the double CTD. This adaptation is effected with the aid of one or two optical fibre reducing plates, dependent on whether there is a double CTD or two CTDs. When there are two CTDs the discontinuity between their two optical fields can be as small as is technologically possible.

The two matrices of the CTD are scanned in accordance with a trace-retrace process, that is successively in alternate directions during which writing is effected. Each storage cell of the CTD is written independently of other cells, but the stored charges are read in accordance with a successive reading by lines or columns with a transfer of charges dependent on the mode associated with the CTD used. The CTD is sequentially erased so that one matrix is erased while the other is written. If a double CTD is used it may have the two sensitive areas exactly juxtaposed, but each of them is read and erased with the aid of the associated circuits arranged below a masked area.

In the absence of the triggering signal the erasure of each of the two CTD matrices can either be effected by the transfer of the image in their memory areas when field transfer matrices are used, or they may be coarsely erased by applying voltage pulses to the transfer control electrodes of the sensitive areas. The first method requires a duration of approximately 1 ms and thus reduces the passband of the system by several tens of kHz, but the second method effects erasure in approximately 1 microsecond and increases the passband to several tens of MHz.

Dependent on the instant when the triggering signal appears during the writing phase, the part of the signal preceding this instant is already written in one part of the CTD which is in the process of writing and in the whole of the other so that the duration of the writing phase can be determined and consequently the entire desired signal can be made visible.

In the writing operation, which is carried out with the aid of trace and retrace sequences, the signal written in the CTD is returned to the starting point at each change of the scanning direction. The two traces which are simultaneously stored in a CTD are easily differentiated with the aid of a flag marker signal produced following the change in scanning direction. The samples of the signal to be analysed are stored in the elementary cells of the CTD in the form of a charge package in addresses X, Y corresponding to parameters of time, amplitude, dependent on their oscilloscope use. The electron beam intensity can be utilized for writing in the cells the state of the flag marker by means of a difference in intensity which can be also be utilized for writing the reference mark corresponding to the triggering instant. The processing unit which processes these stored data for the purpose of making them visible takes the flag marker into account for displaying the correct variation of the signal to be analysed on the screen.

BRIEF DESCRIPTION OF THE DRAWING

The present invention will now be explained and described, by way of example, with reference to the accompanying drawing, in which figures:

FIG. 2 is a diagrammatic representation of the arrangement of the two juxtaposed CTD matrices suitable for use in a device made in accordance with the invention;

FIG. 3A illustrates a writing sequence, as a function of time, formed from trace and retrace scans on the surfaces of the juxtaposed matrices;

FIG. 3B illustrates the intensity variations of electron beam current forming the scans;

DESCRIPTION OF THE PREFERRED EMBODIMENTS

Figure 1:
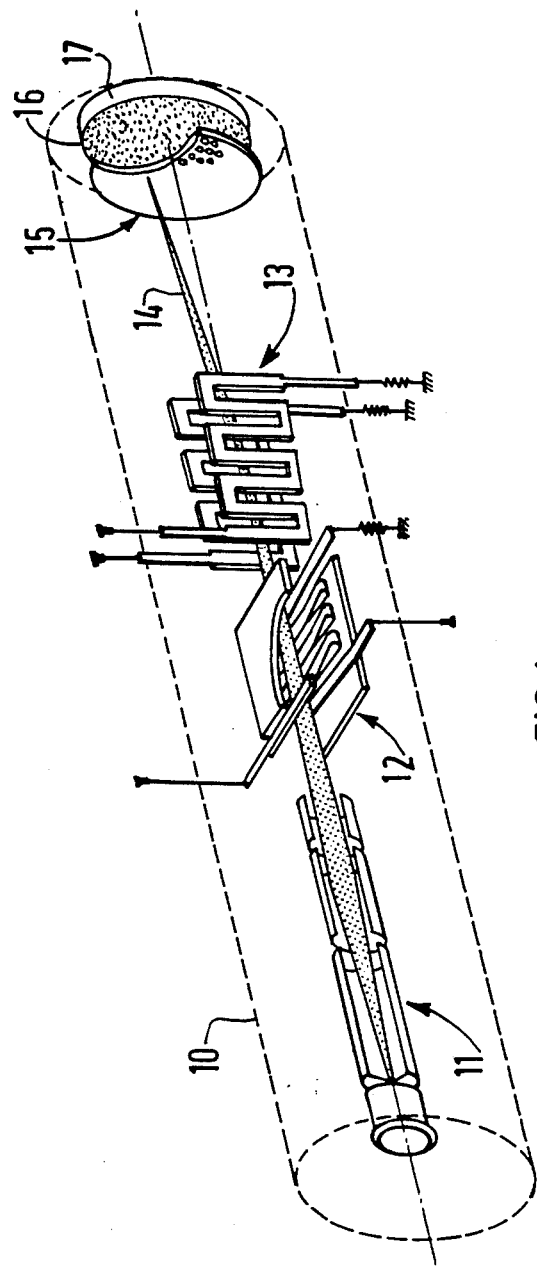
FIG. 1 is a perspective diagrammatical view of essential elements, partly broken away, of an oscilloscope of the known type to which the device made in accordance with the present invention may be applied.

FIG. 1 shows an oscilloscope tube of the known type. A vacuum envelope 10 accommodates an electron gun 11 provided with several electrodes which emit an electron beam which can be deflected electrostatically by signal deflection means 12 in a vertical direction and by time base deflection means 13 in a horizontal direction. The deflected electron beam 14 is scanned across the input side of a microchannel plate electron multiplier 15 which amplifies the beam current. The secondary electrons emerging from the respective channels of the electron multiplier excite a phosphor screen 16 provided on a fireplate 17 which emits light in accordance with a written trace written by the electrons. The fireplate of the tube is constituted by an optical fibre plate which directs the emitted luminous flux to a CTD on which the image of the signal to be analysed is written.

For pre-triggering; the oscilloscope include a dual CTD matrix in which the boundary between the two matrices is substantially perpendicular to the scanning direction X corresponding to the time base. This is diagrammatically shown in FIG. 2. The two matrices 21 and 22 are juxtaposed so that their sensitive areas 23 and 24, viewed from the tube gun, appear without any overlap or discontinuities. These sensitive areas 23 and 24 are read or erased with the aid of appropriate circuits which are generally located at their periphery in the masked areas 25 and 26, respectively. These areas 25, 26 may overlap the sensitive areas 23 and 24.

Scanning with respect to time of the sensitive areas 23 and 24 is effected in accordance with the diagram shown in FIG. 3A. The scanning direction at the surface of the two matrices is effected in accordance with the direction X (trace) or the opposite direction (retrace). The time axis is represented by the reference T. Let it be assumed that at the initial instant the writing operation begins the centrally disposed interface of the two matrices represented by the point 31. Scanning is effected towards the right (trace) as far as the extremity of the matrix 24 and reaches the point 32 where the scanning direction reverses (retraces). A second writing operation is effected on the matrix 24 after which a first writing operation is effected on the matrix 23. At the extremity of this matrix 23 the scanning reaches the point 34 where it reverses again so as to reach the point 36, and so on. In the course of one complete sequence (represented by the path 31, 32, 33, 34, 35) two writing operations are carried out on each matrix. It is desirable not to superpose two traces for each matrix lest the ultimate reading problems become too complicated. In this case two alternate erasures of the two matrices must be carried out. One matrix is erased just before this matrix is written. In FIG. 3A the matrix 23 is erased in the course of the time period represented by cross-hatched area 37 and may be terminated at the point 33. Similarly matrix 24 is erased in the course of the time period represented by the cross hatched area 38 and can be terminated at the reference marker 35. Individual erasure of the CTD is effected in a period which is shorter than substantially $10^{-4}$ times the reading time of the image. It may be very short, of the order of 1 microsecond.

In order to carry out pre-triggering, the triggering signal may arrive at an arbitrary instant in the sequence. If the triggering signal arrives at the instant represented by the letter C (FIG. 3A), the writing scan will continue until the time represented by the reference numeral 35. The information written in the course of the sequence 31-32-33-34-35 is stored in the two matrices. Thus there are approximately 3 traces (31 to 32; 32 to 33; and 33 to 34) and 1 trace (34 to 35) for representing the signals preceding or succeeding this triggering signal. If the triggering signal appeared at the instant corresponding to reference numeral 33, there would be 2 traces in this case for representing the signals preceding and succeeding the triggering signal. If this signal appeared at the instant A, there would be 1 trace and 3 traces for representing the signals preceding and suceeding the triggering signal.

For differentiating the directions, right to left and left to right, of the two traces which are written in the CTD, the beam current is modulated at two current levels in order to locally write quantities of supplementary charges. This is represented in FIG. 3B by the curve 50 showing the beam current variations with time. These two levels can be translated into logic levels 0 and 1, thus defining a flag marker. Upon reproduction the proper timing sequence may be reconstructed on the display screen. In addition, a bright dot can be superposed for defining the triggering instant. In FIG. 3B a higher current 51 of short duration is shown at the instant when a triggering signal appears at A.

Figure 4:
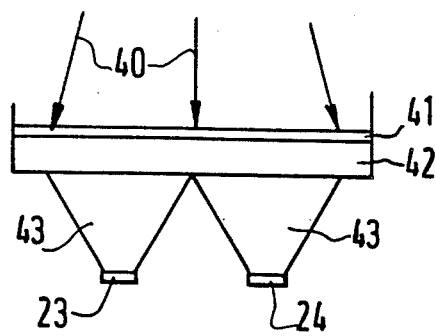
FIG. 4 is an arrangement of the two CTD matrices coupled to the screen with the aid of two optical fibre reducing plates in accordance with a photosensitive mode.

FIG. 4 shows an assembly mode of the two matrices 23 and 24. The electron beam 40 reaches the luminescent screen 41 provided on an optical fibre plate 42 which serves as a support. Since the dimensions of the CTD matrices are very small (approximately 6×5 mm) with respect to the dimensions of the tube screen, it is necessary to adapt the optical fields. This is realised with the aid of optical fibre concentration plates 43 which adapt the two optical fields without any discontinuities or overlaps.

Figure 5:
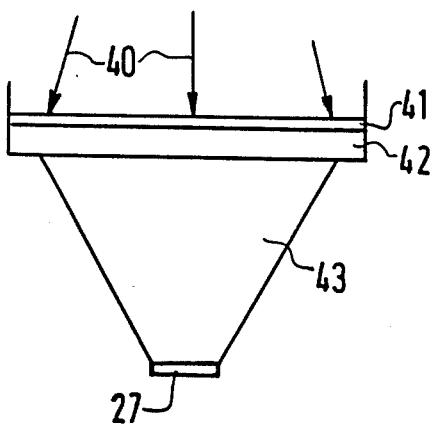
FIG. 5 is an arrangement analogous to that of FIG. 4 with a double CTD matrix.

In the case of the two matrices being combined in a double CTD, the solution is analogous. It is shown in FIG. 5 using the same reference numerals and the double CTD 27.

Figure 6:
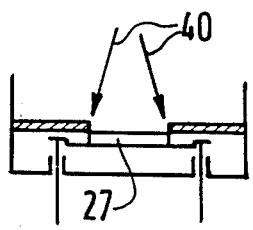
FIG. 6 is an arrangement of a double CTD matrix in the electron-sensitive mode.

It is also possible to use a double CTD 27 in accordance with the electron-sensitive mode shown in FIG. 6. In this case the electron beam 40 acts directly on the CTD 27 in which electric charges are stored in an analogous manner.

When the writing sequence is terminated by the arrival of a triggering signal at the end of scanning the CTD on which writing is effected, the stored charges are read with the aid of circuits located in the masked areas of the CTDs and the signal is processed with the aid of a processing device exploiting the state of the flag marker, which involves with the trace or retrace scanning associated with each matrix.

What is claimed is:

1. An apparatus for storing and reproducing an electrical signal, said apparatus comprising:
   a. a vacuum tube including a faceplate supporting an arrangement of first and second charge transfer device matrices for temporarily storing charges representing the signal, said matrices being juxtaposed along a common boundary extending in a predefined direction;
   b. an electron gun for producing an electron beam directed toward said faceplate to effect charge storage in said first and second charge transfer device matrices;
   c. first deflection means which deflect the electron beam across the faceplate in first and second reciprocal directions transverse to the common boundary of the charge transfer device matrices;
   d. second deflection means which deflect the electron beam across the faceplate transversely to the first and second reciprocal directions in response to the instantaneous magnitude of the signal; and
   e. read circuitry means electrically connected to the charge transfer device matrices which respond to the occurrence of a triggering signal to effect reading of the charges stored in the first and second charge transfer device matrices during substantial periods preceding and succeeding the occurrence of the triggering signal.

2. An apparatus as in claim 1 where the first and second charge transfer device matrices are formed in a single substrate.

3. An apparatus as in claim 1 where the electron beam produced by the electron gun effects charging of the first and second charge transfer device matrices by impinging thereon.

4. An apparatus as in claim 1 including a luminescent screen disposed on the faceplate for producing a luminous trace in response to deflection of the electron beam across said screen, and including means which optically couple said screen to the first and second charge transfer device matrices, said matrices comprising photosensitive material for producing charges in response to said luminous trace.

5. An apparatus as in claim 4 where the means which optically couple comprises optical fibers.

6. An oscilloscope comprising the apparatus of claim 1.

7. An apparatus as in claim 1 further comprising means which modulate current in the electron beam to a first magnitude representative of the first direction and to a second magnitude representative of the second direction.

8. An apparatus as in claim 1 further comprising means which modulate the electron beam current at the instant of occurrence of the triggering signal to effect storage at a corresponding position in the charge transfer device matrix arrangement of a charge quantity indicating when said instant occurred.

* * * * *